US010467516B2

(12) United States Patent
Osamura et al.

(10) Patent No.: US 10,467,516 B2
(45) Date of Patent: Nov. 5, 2019

(54) COMPONENT BUILT-IN DEVICE

(71) Applicant: Murata Manufacturing Co., Ltd., Nagaokakyo-shi, Kyoto-fu (JP)

(72) Inventors: Makoto Osamura, Nagaokakyo (JP); Yoshihito Otsubo, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/004,620

(22) Filed: Jun. 11, 2018

(65) Prior Publication Data

US 2018/0293480 A1 Oct. 11, 2018

Related U.S. Application Data

(63) Continuation of application No. PCT/JP2016/086967, filed on Dec. 13, 2016.

(30) Foreign Application Priority Data

Dec. 21, 2015 (JP) ................................ 2015-248704

(51) Int. Cl.
*G06K 19/00* (2006.01)
*G06K 19/077* (2006.01)
(Continued)

(52) U.S. Cl.
CPC ....... *G06K 19/07722* (2013.01); *G06K 19/02* (2013.01); *G06K 19/0723* (2013.01); *G06K 19/0775* (2013.01); *G06K 19/07749* (2013.01); *G06K 19/07754* (2013.01); *G06K 19/07783* (2013.01); *H01Q 9/16* (2013.01); *H01Q 9/285* (2013.01); *H04B 1/40* (2013.01); *H04B 5/0025* (2013.01); *H01Q 1/2225* (2013.01); *H01Q 1/2283* (2013.01); *H01Q 9/24* (2013.01);
(Continued)

(58) Field of Classification Search
USPC ........................ 235/435, 439, 451, 487, 492
See application file for complete search history.

(56) References Cited

U.S. PATENT DOCUMENTS

2008/0042851 A1 2/2008 Baba et al.
2009/0115577 A1* 5/2009 Kobayashi ....... G06K 19/07728 340/10.1
(Continued)

FOREIGN PATENT DOCUMENTS

JP 2008-46668 A 2/2008
JP 2008-299465 A 12/2008
(Continued)

OTHER PUBLICATIONS

Official Communication issued in International Patent Application No. PCT/JP2016/086967, dated Feb. 28, 2017.

*Primary Examiner* — Matthew Mikels
(74) *Attorney, Agent, or Firm* — Keating & Bennett, LLP

(57) ABSTRACT

An RFID module includes a laminated body including thermoplastic resin layers, a passive element defined by a conductor pattern on the thermoplastic resin layers, and an RFID IC chip embedded in the laminated body. The RFID IC chip and the conductor pattern are connected to each other by joining an input and output terminal of the RFID IC chip and a pad electrode, and an insulator pattern overlapping the pad electrode is provided around the RFID IC chip in the laminated body in planar view.

7 Claims, 21 Drawing Sheets

101

(51) Int. Cl.

| | |
|---|---|
| ***G06K 19/02*** | (2006.01) |
| ***H01Q 9/16*** | (2006.01) |
| ***H04B 1/40*** | (2015.01) |
| ***G06K 19/07*** | (2006.01) |
| ***H01Q 9/28*** | (2006.01) |
| ***H04B 5/00*** | (2006.01) |
| *H01Q 1/22* | (2006.01) |
| *H01Q 9/24* | (2006.01) |
| *H05K 1/18* | (2006.01) |

(52) U.S. Cl.
CPC ..... *H05K 1/185* (2013.01); *H05K 2201/0129* (2013.01); *H05K 2201/10098* (2013.01)

(56) References Cited

U.S. PATENT DOCUMENTS

| | | | | |
|---|---|---|---|---|
| 2009/0266900 | A1 | 10/2009 | Ikemoto et al. | |
| 2012/0213885 | A1* | 8/2012 | Nishizawa .......... | B29C 45/1671 425/588 |
| 2013/0213699 | A1 | 8/2013 | Chisaka | |
| 2014/0029222 | A1 | 1/2014 | Saito et al. | |
| 2014/0030471 | A1 | 1/2014 | Otsubo | |
| 2015/0305150 | A1 | 10/2015 | Ohata | |

FOREIGN PATENT DOCUMENTS

| | | | |
|---|---|---|---|
| JP | 2015-133153 | A | 7/2015 |
| WO | 2012/046829 | A1 | 4/2012 |
| WO | 2012/137548 | A1 | 10/2012 |
| WO | 2012/137626 | A1 | 10/2012 |
| WO | 2014/109139 | A1 | 7/2014 |

* cited by examiner

206A

COMPONENT BUILT-IN DEVICE

CROSS REFERENCE TO RELATED APPLICATIONS

This application claims the benefit of priority to Japanese Patent Application No. 2015-248704 filed on Dec. 21, 2015 and is a Continuation Application of PCT Application No. PCT/JP2016/086967 filed on Dec. 13, 2016. The entire contents of each application are hereby incorporated herein by reference.

BACKGROUND OF THE INVENTION

1. Field of the Invention

The present invention relates to a component built-in device including a chip electronic component in a laminated body of a resin layer, an RFID tag including the component built-in device, and a method for manufacturing the component built-in device.

2. Description of the Related Art

An RFID tag used for information management or the like of an article includes an RFID IC chip that holds prescribed information and processes a predetermined radio signal and an antenna element that transmits and receives a high-frequency signal. The FRID tag is used while being provided to various articles to be managed or their packaging materials.

An HF-band RFID system using a 13.56-MHz band or a UHF-band RFID system using a 900-MHz band is typically used as the RFID system. In the UHF-band RFID system, a communication distance is relatively long and a plurality of tags are able to collectively be read. A tag having a structure disclosed in Japanese Unexamined Patent Publication No. 2015-133153 is known as a UHF-band RFID tag.

The RFID tag disclosed in Japanese Unexamined Patent Publication No. 2015-133153 includes a printed wiring board on which a radiating element is formed and an electromagnetic coupling module including an RFIC. For example, the electromagnetic coupling module includes a feeder circuit board including a ceramic board and a semiconductor RFIC chip. An external terminal is provided on a lower surface of the feeder circuit board, the RFIC chip is mounted on an upper surface, and the upper surface of the feeder circuit board is coated with a protective film so as to cover the RFIC chip.

In the module having the structure in which the IC chip is mounted on the feeder circuit board as disclosed in Japanese Unexamined Patent Publication No. 2015-133153, a thickness less than a sum of a thickness of the feeder circuit board and a thickness of the IC chip can hardly be implemented, and the RFID tag has a thickness limitation.

On the other hand, a module similar to the above module is able to be electrically defined even in a structure in which a predetermined conductor pattern is formed in a laminated body of thermoplastic resin layers and the IC chip is embedded in the laminated body. The module defined by the laminated body of the resin sheets is easily thinned and has flexibility, so that the module is suitable for the thin RFID tag in which flexibility is needed.

However, in the structure in which the IC chip is embedded in the laminated body of the thermoplastic resin layers, the pad electrode conducted with an input and output terminal of the IC chip is deformed, and the pad electrode possibly comes into contact with an edge of the IC chip during collective lamination of the resin sheets. FIGS. 20A, 20B, and 21 illustrate examples. FIG. 20A is a cross-sectional view of a main portion of an RFID module, and FIG. 20B is a partially enlarged view of the RFID module. FIG. 21 is a partially enlarged cross-sectional view illustrating a main portion of another RFID module. A conductor pattern is formed on each resin sheet, and pad electrodes 21*a*, 21*b* are deformed in association with deformation of a resin layer particularly in the vicinity of a rigid IC chip 50 (resin flow during pressing) during the collective lamination of a plurality of resin sheets.

As illustrated in FIGS. 20A, 20B, and 21, when the pad electrodes 21*a*, 21*b* come into contact with an edge of the IC chip 50, the pad electrodes 21*a*, 21*b* are in electrical conduction with the IC chip 50, and an electrical characteristic is degraded or a malfunction is generated.

The above problem is not limited to the RFID module, but is common to all of the component built-in devices having the structure in which the chip electronic component is embedded in the laminated body of the thermoplastic resin layers.

SUMMARY OF THE INVENTION

Preferred embodiments of the present invention provide component built-in devices in each of which the structure and electrical connection around the chip electronic component in the laminated body are stabilized in the component built-in devices having the structure in which the chip electronic components are embedded in the laminated body of the thermoplastic resin layers, RFID tags including the component built-in devices, and methods for manufacturing the component built-in devices.

A component built-in device according to a preferred embodiment of the present invention includes a laminated body including a plurality of thermoplastic resin layers; a passive element defined by a conductor pattern provided on the thermoplastic resin layers; and a chip electronic component embedded in the laminated body; wherein the chip electronic component includes an input and output terminal, the laminated body includes a pad electrode connected to the passive element, the chip electronic component and the passive element are connected to each other via a direct or indirect connection between the input and output terminal and the pad electrode, and a belt-shaped or annular insulator pattern overlapping the pad electrode is provided around the chip electronic component in the laminated body in planar view from a laminating direction of the thermoplastic resin layers.

With this configuration, the insulator pattern around the chip electronic component defines and functions as a reinforcing member to reduce or prevent deformation of the conductor pattern around the chip electronic component to overcome the above-described problems.

Preferably, the conductor pattern is a coil-shaped conductor pattern, the coil-shaped conductor pattern is provided in a region that does not overlap the chip electronic component in planar view from the laminating direction, and the insulator pattern is provided at a position that does not overlap the coil-shaped conductor pattern. Consequently, local deformation of the coil-shaped conductor pattern due to the insulator pattern is avoided, and an electrical characteristic of the passive element is stabilized.

In a component built-in device according to a preferred embodiment of the present invention, preferably the insulator pattern overlaps an outer edge of the pad electrode in planar view from the laminating direction. When the input and output terminal of the chip electronic component is connected closer to an inner edge of the pad electrode, displacement tends to increase towards the outer edge of the pad electrode during collective lamination of the thermoplastic resin sheets. Thus, the deformation of the pad electrode is effectively reduced or prevented.

In a component built-in device according to a preferred embodiment of the present invention, preferably the insulator pattern primarily includes a thermoplastic resin that is identical to a resin of the thermoplastic resin layer. Consequently, warpage and deformation of the laminated body are unlikely to be generated. Additionally, adhesion between layers is not obstructed, interlayer peeling or other detachment is unlikely to be generated, and degradation of an electrical characteristic is unlikely to be generated.

In a component built-in device according to a preferred embodiment of the present invention, the insulator pattern may preferably be provided in a plurality of layers in the laminated body. Consequently, a reinforcing effect of the insulator pattern is increased.

In a component built-in device according to a preferred embodiment of the present invention, the insulator pattern may preferably have a shape that surrounds an entire or substantially an entire periphery of the chip electronic component in planar view from the laminating direction. Consequently, deformation of the resin layer around the chip electronic component in the laminated body becomes uniform, and the deformation of the pad electrode is effectively reduced or prevented.

In a component built-in device according to a preferred embodiment of the present invention, preferably the input and output terminal of the chip electronic component is in contact with the pad electrode, and at least a portion of the insulator pattern is in contact with the pad electrode. Consequently, the reinforcing effect in the vicinity of the pad electrode is improved, and the deformation of the pad electrode is further reduced or prevented.

An RFID tag according to a preferred embodiment of the present invention includes a flexible insulator substrate including a radiating element; and an RFID module including an external terminal, the RFID module being mounted on the insulator substrate, and the external terminal being connected to the radiating element, wherein the RFID module includes a laminated body including a plurality of thermoplastic resin layers; a coil-shaped conductor pattern defined by a conductor provided on the thermoplastic resin layers; and an RFID IC embedded in the laminated body, the RFID IC includes an input and output terminal, the laminated body includes a pad electrode and the external terminal which are connected to the coil-shaped conductor pattern, the RFID IC and the coil-shaped conductor pattern are connected to each other via a direct or indirect connection between the input and output terminal and the pad electrode, and a belt-shaped or annular insulator pattern overlapping the pad electrode is provided around the RFID IC in the laminated body in planar view from a laminating direction of the thermoplastic resin layers.

With this configuration, the high-reliability RFID tag is obtained in which a characteristic deterioration or a malfunction of the FRID IC is prevented.

In an RFID tag according to a preferred embodiment of the present invention, preferably the laminated body has a longitudinal direction, the coil-shaped conductor pattern includes a first coil-shaped conductor pattern and a second coil-shaped conductor pattern, the first coil-shaped conductor pattern is disposed closer to a first end in the longitudinal direction, the second coil-shaped conductor pattern is disposed closer to a second end in the longitudinal direction, and the RFID IC is disposed between the first coil-shaped conductor pattern and the second coil-shaped conductor pattern in planar view from the laminating direction. This enables miniaturization of the RFID tag, and unnecessary coupling between the coil defined by the first coil-shaped conductor pattern and the coil defined by the second coil-shaped conductor pattern is reduced or prevented.

A method for manufacturing a component built-in device according to a preferred embodiment of the present invention is a method of manufacturing a component built-in device including a laminated body including a plurality of thermoplastic resin layers, a passive element defined by a conductor pattern formed on the thermoplastic resin layers, and a chip electronic component embedded in the laminated body, the method including forming the passive element and a pad electrode connected to the passive element on a predetermined thermoplastic resin sheet among a plurality of thermoplastic resin sheets; forming an insulator pattern on a predetermined thermoplastic resin sheet among the plurality of thermoplastic resin sheets at a position that is around the chip electronic component and that overlaps the pad electrode in planar view; and forming the laminated body by laminating and pressure-bonding the plurality of thermoplastic resin sheets together with the chip electronic component.

In this manufacturing method, the insulator pattern around the chip electronic component defines and functions as a reinforcing member, and the component built-in device in which the structure and electrical connection around the chip electronic component in the laminated body are stabilized are obtained.

According to preferred embodiments of the present invention, it is possible to obtain the component built-in devices and the RFID tags including the component built-in devices, in which the structure and electrical connection around the chip electronic component in the laminated body are stabilized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
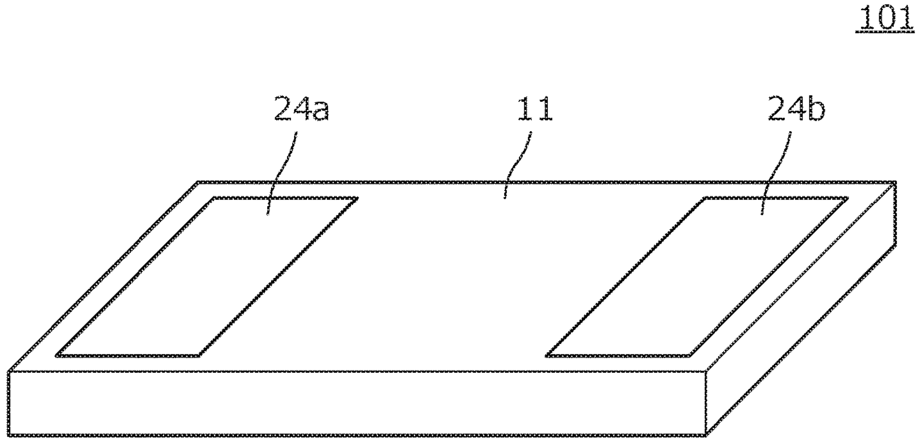
FIG. 1 is a perspective view of an RFID module 101 according to a first preferred embodiment of the present invention.

Hereinafter, preferred embodiments of the present invention will be described with reference to the drawings by describing several specific examples. In each drawing, the same portion is denoted by the same reference numeral. The preferred embodiments are separately illustrated for the sake of ease of explanation or understanding of the gist, but configurations illustrated in different preferred embodiments may partially be substituted or combined. In the second and subsequent preferred embodiments, descriptions of matters common to those of the first preferred embodiment are omitted, and only different points will be described. In particular, the similar advantageous effects by the similar configurations will not sequentially be referred to in each preferred embodiment.

First Preferred Embodiment

FIG. 1 is a perspective view illustrating an RFID module 101 according to a first preferred embodiment of the present invention. The RFID module 101 according to the first preferred embodiment is preferably, for example, an RFID module corresponding to a communication frequency of a 900 MHz band, namely, a UHF band, and includes a rectangular or substantially rectangular parallelepiped laminated body 11. The laminated body includes thermoplastic resin layers, such as liquid crystal polymer and polyimide, for example, that are laminated, and the laminated body 11 has flexibility. A dielectric constant of each insulating layer made of these materials is preferably smaller than that of a ceramic base material layer represented by LTCC.

External terminals 24*a*, 24*b* are provided on a mounting surface (an upper surface from a viewpoint in FIG. 1) of the laminated body 11. The RFID module 101 is mounted on an antenna base material (to be described later). The external terminals 24*a*, 24*b* are connected to radiating elements on the antenna base material by the mounting.

Figure 2:
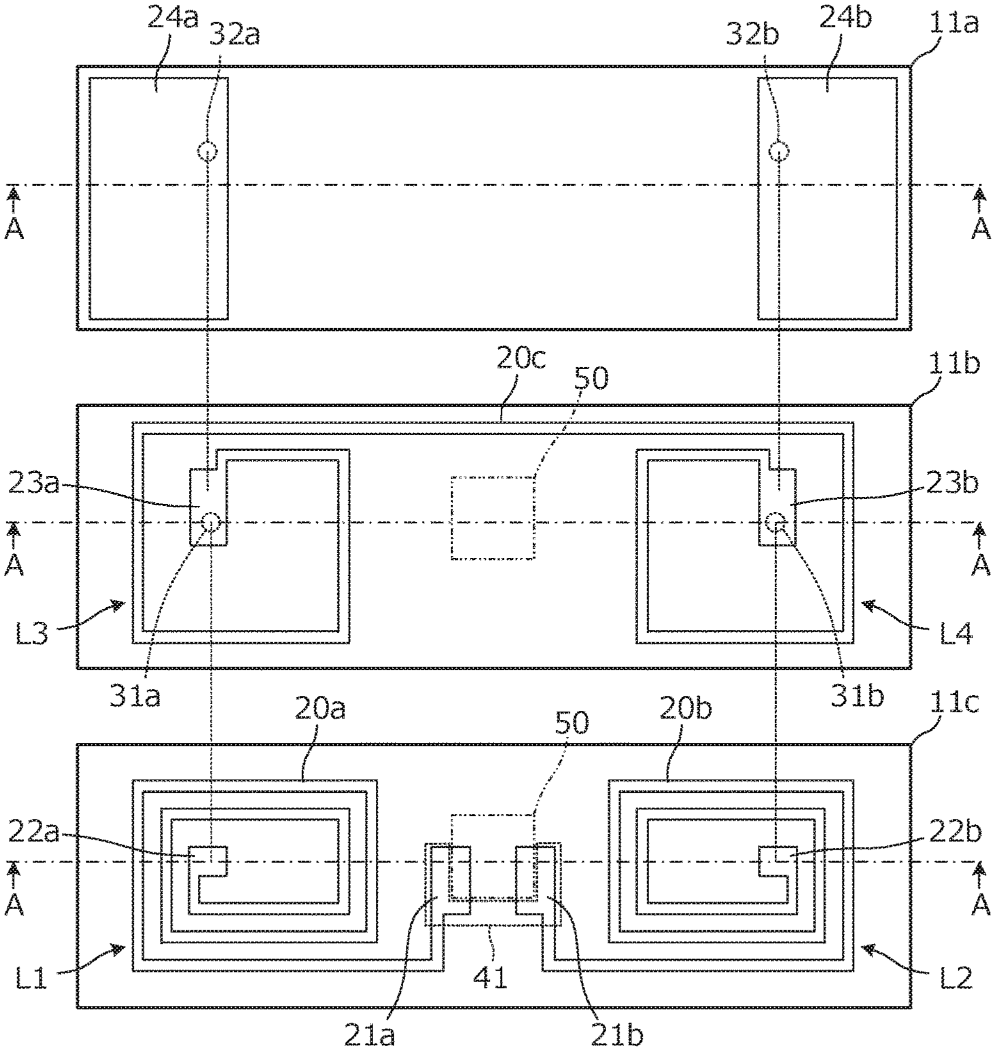
FIG. 2 is a plan view illustrating an example of thermoplastic resin sheets and various conductor patterns provided on the thermoplastic resin sheets defining the RFID module 101.

FIG. 2 is a plan view illustrating an example of thermoplastic resin sheets and various conductor patterns provided on the thermoplastic resin sheets defining the RFID module 101.

Spiral conductor patterns 20*a*, 20*b* having a rectangular or substantially rectangular shape are provided on a thermoplastic resin sheet (hereinafter, simply referred to as a "resin sheet") 11*c*. A pad electrode 21*a* is provided at a first end of the conductor pattern 20*a*, and an end electrode 22*a* is provided at a second end of the conductor pattern 20*a*. Similarly, a pad electrode 21*b* is provided at a first end of the conductor pattern 20*b*, and an end electrode 22*b* is provided at a second end of the conductor pattern 20*b*. A conductor pattern 20*c* including two rectangular or substantially rectangular spiral portions is provided on a resin sheet 11*b*. End electrodes 23*a*, 23*b* are provided at both ends of the conductor pattern 20*c*. External terminals 24*a*, 24*b* are provided on a resin sheet 11*a*. A passive element is defined by the conductor patterns 20*a*, 20*b*, 20*c*.

The end electrode 22*a* of the conductor pattern 20*a* and the end electrode 23*a* of the conductor pattern 20*c* are connected to each other through a via conductor 31*a*. The end electrode 22*b* of the conductor pattern 20*b* and the end electrode 23*b* of the conductor pattern 20*c* are connected to each other through a via conductor 31*b*. The end electrodes 23*a*, 23*b* of the conductor pattern 20*c* and the external terminals 24*a*, 24*b* are connected to each other through via conductors 32*a*, 32*b*.

Figure 3:
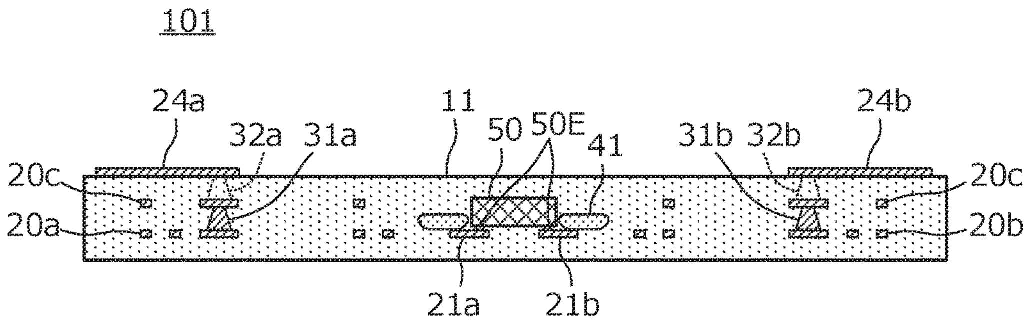
FIG. 3 is a cross-sectional view illustrating the RFID module 101 taken along a line A-A in FIG. 2.

FIG. 3 is a cross-sectional view illustrating the RFID module 101 taken along a line A-A in FIG. 2. The rectangular or substantially rectangular spiral portion on the left side of the conductor pattern 20*c* overlaps the conductor pattern 20*a* in a substantially coaxial relationship. Similarly, the rectangular or substantially rectangular spiral portion on the right side of the conductor pattern 20*c* overlaps the conductor pattern 20*b* in the substantially coaxial relationship. An input and output terminal 50E of an RFID IC chip 50 is connected to the pad electrodes 21*a*, 21*b*. With this structure, the rectangular or substantially rectangular spiral portion on the left side of the conductor pattern 20*c* and the conductor pattern 20*a* define a first coil-shaped conductor pattern, and the rectangular or substantially rectangular spiral portion on the right side of the conductor pattern 20*c* and the conductor pattern 20*b* define a second coil-shaped conductor pattern.

The laminated body 11 has a longitudinal direction, the first coil-shaped conductor pattern is disposed closer to the first end in the longitudinal direction, the second coil-shaped conductor pattern is disposed closer to the second end in the longitudinal direction, and the RFID IC chip 50 is disposed between the first coil-shaped conductor pattern and the second coil-shaped conductor pattern in planar view from the laminating direction of the thermoplastic resin layer. This enables miniaturization of the RFID module 101, and unnecessary coupling between a coil defined by the first coil-shaped conductor pattern and a coil defined by the second coil-shaped conductor pattern is reduced or prevented.

Figure 4:
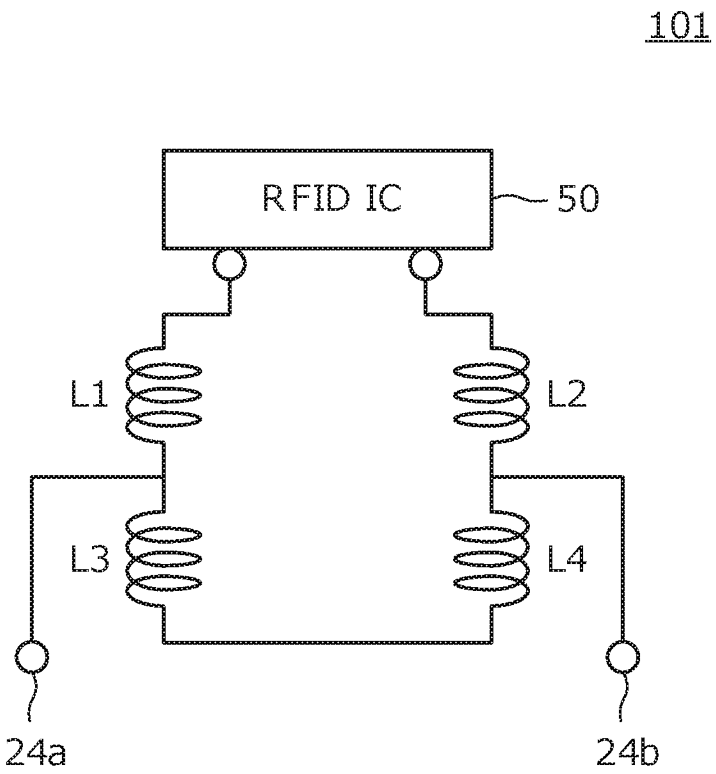
FIG. 4 is a circuit diagram illustrating the RFID module 101.

FIG. 4 is a circuit diagram of the RFID module 101. In FIG. 4, inductors L1, L2 correspond to the conductor patterns 20*a*, 20*b*, and inductors L3, L4 correspond to the conductor pattern 20*c*.

As illustrated in FIGS. 2 and 3, in a planar view from the laminating direction of the resin sheet, an insulator pattern 41 having a belt shape, an annular shape or a partial annular shape is provided at a position overlapping the pad electrodes 21*a*, 21*b* around the RFID IC chip 50 in the laminated body 11.

According to the first preferred embodiment, the insulator pattern 41 around the RFID IC chip 50 defines and functions as a reinforcing material to reduce or prevent deformation of the conductor pattern around the RFID IC chip 50, particularly the pad electrodes 21*a*, 21*b*. Since the insulator pattern 41 also reduces or prevents a flow of resin during pressurization and heating of the resin sheet, the deformation of the pad electrodes 21*a*, 21*b* is reduced or prevented. Contact between the pad electrodes 21*a*, 21*b* and the RFID IC chip 50 due to the deformation of the pad electrodes 21*a*, 21*b* is avoided by these functions and actions.

Although outer edges of the pad electrodes 21*a*, 21*b* protrude beyond an outer shape of the RFID IC chip 50 in planar view, the problem caused by the deformation of the pad electrodes 21*a*, 21*b* is avoided, so that the RFID IC chips 50 having various sizes are able to be embedded. That is, the same laminated body 11 is able to be used for RFID IC chips having different sizes.

A method for manufacturing the RFID module 101 according to the first preferred embodiment is as follows.

A thermoplastic resin sheet to which a Cu foil is attached on one side is prepared, and the Cu foil is patterned by photolithography, for example, to form a predetermined conductor pattern on each of the thermoplastic resin sheets 11*a*, 11*b*, 11*c*. That is, the conductor patterns 20*a*, 20*b* and the pad electrodes 21*a*, 21*b* are formed on the thermoplastic resin sheet 11*c*. The conductor pattern 20*c* is formed on the thermoplastic resin sheet 11*b*. The external terminals 24*a*, 24*b* are formed on the thermoplastic resin sheet 11*a*.

Subsequently, a via hole is formed at a predetermined position of the thermoplastic resin sheet by a laser processing method, and filled with a conductive paste by a screen printing method or other suitable method, for example. The conductive paste becomes a via conductor in a later process. That is, the via conductors 31*a*, 31*b* are formed in the thermoplastic resin sheet 11*c*, and the via conductors 32*a*, 32*b* are formed in the thermoplastic resin sheet 11*b*.

The insulator pattern 41 is formed by application on the thermoplastic resin sheet 11*c* around the RFID IC chip 50 and at a position overlapping the pad electrodes 21*a*, 21*b* in planar view.

The thermoplastic resin sheets 11*a*, 11*b* and 11*c* are laminated together with the RFID IC chip 50, and pressed and heated to form the laminated body 11.

An aggregate substrate including a large number of RFID modules 101 is processed in each of the above processes, and then divided into individual pieces to obtain a large number of RFID modules 101.

Second Preferred Embodiment

Some examples having a shape of an insulator pattern or a shape of a pad electrode different from that of the first preferred embodiment are illustrated in a second preferred embodiment of the present invention.

Figure 5:
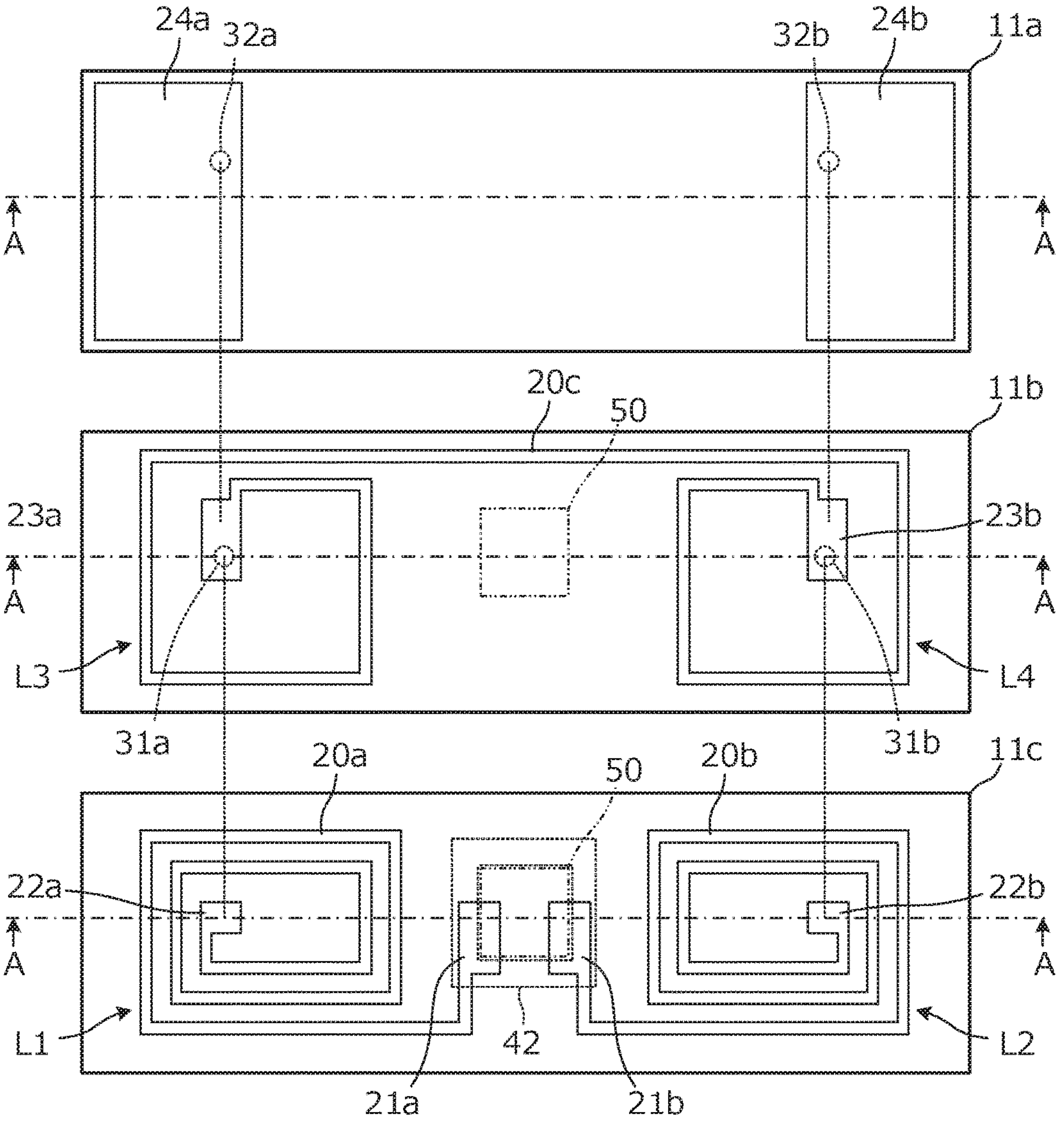
FIG. 5 is a plan view illustrating an example of resin sheets and various conductor patterns provided on the resin sheets defining an RFID module according to a second preferred embodiment of the present invention.

FIG. 5 is a plan view illustrating an example of resin sheets and various conductor patterns provided on the resin sheets defining an RFID module according to the second preferred embodiment. An annular insulator pattern 42 having a rectangular or substantially rectangular shape is provided in this example. Other configurations are the same or substantially the same as those of the RFID module 101 according to the first preferred embodiment.

Figure 6:
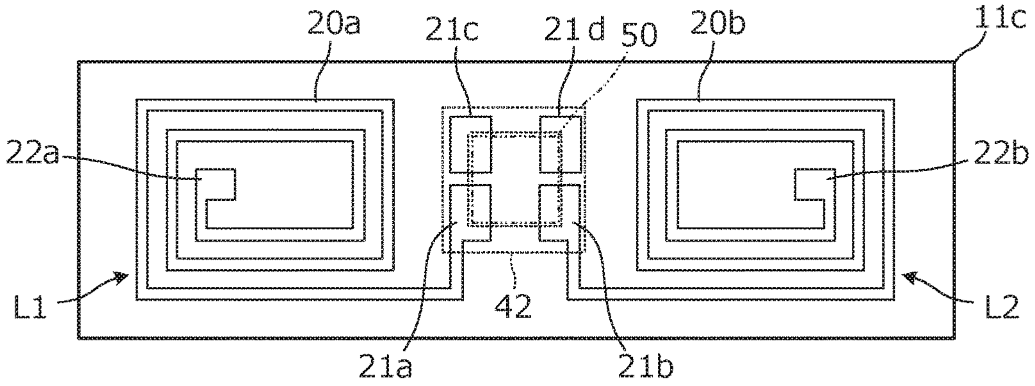
FIG. 6 is a plan view illustrating one resin sheet included in another RFID module according to the second preferred embodiment of the present invention.

FIG. 6 is a plan view illustrating one resin sheet included in another RFID module according to the second preferred embodiment. In this example, pad electrodes 21*c*, 21*d* are provided in addition to pad electrodes 21*a*, 21*b*. The pad electrodes 21*a*, 21*b* are electrically connected to a circuit in an RFID IC chip, while the pad electrodes 21*c*, 21*d* are dummy electrodes. Additionally, an annular insulator pattern 42 having a rectangular or substantially rectangular shape, which overlaps the pad electrodes 21*a*, 21*b*, 21*c*, 21*d* in planar view, is provided in this example. Other configurations are the same or substantially the same as those of the RFID module of the first preferred embodiment.

Figure 7:
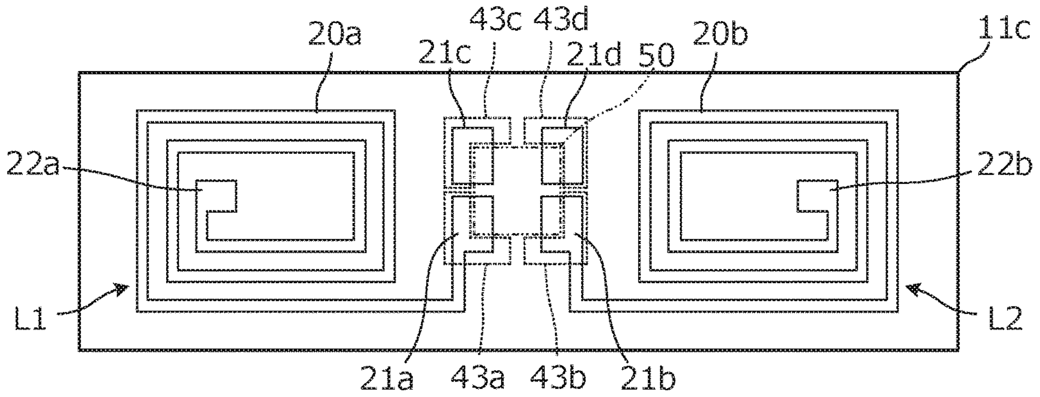
FIG. 7 is a plan view illustrating one resin sheet included in still another RFID module according to the second preferred embodiment of the present invention.

FIG. 7 is a plan view illustrating one resin sheet included in still another RFID module according to the second preferred embodiment. In this example, pad electrodes 21*c*, 21*d* are provided in addition to pad electrodes 21*a*, 21*b*. Additionally, partial annular shaped (L-shaped) insulator patterns 43*a*, 43*b*, 43*c*, 43*d* having rectangular or substantially rectangular shapes, which individually overlap the pad electrodes 21*a*, 21*b*, 21*c*, 21*d* in planar view, are provided. Other configurations are the same or substantially the same as those of the RFID module of the first preferred embodiment.

As illustrated in FIGS. 5 and 6, the insulator pattern may have an annular shape. Consequently, a degree of reinforcement around the embedded position of the RFID IC chip 50 is easily equalized, and the deformation of the pad electrodes 21*a*, 21*b* is effectively reduced or prevented.

As illustrated in FIGS. 6 and 7, when the pad electrodes are equally arranged around the RFID IC chip 50, an inclination of the RFID IC chip 50 is relaxed in the laminated body, and the deformation of the pad electrodes 21*a*, 21*b* is effectively reduced or prevented.

Third Preferred Embodiment

An example in which the connection structure between the input and output terminal of the RFID IC chip and the pad electrode is different from that of the first preferred embodiment is illustrated in a third preferred embodiment of the present invention.

Figure 8:
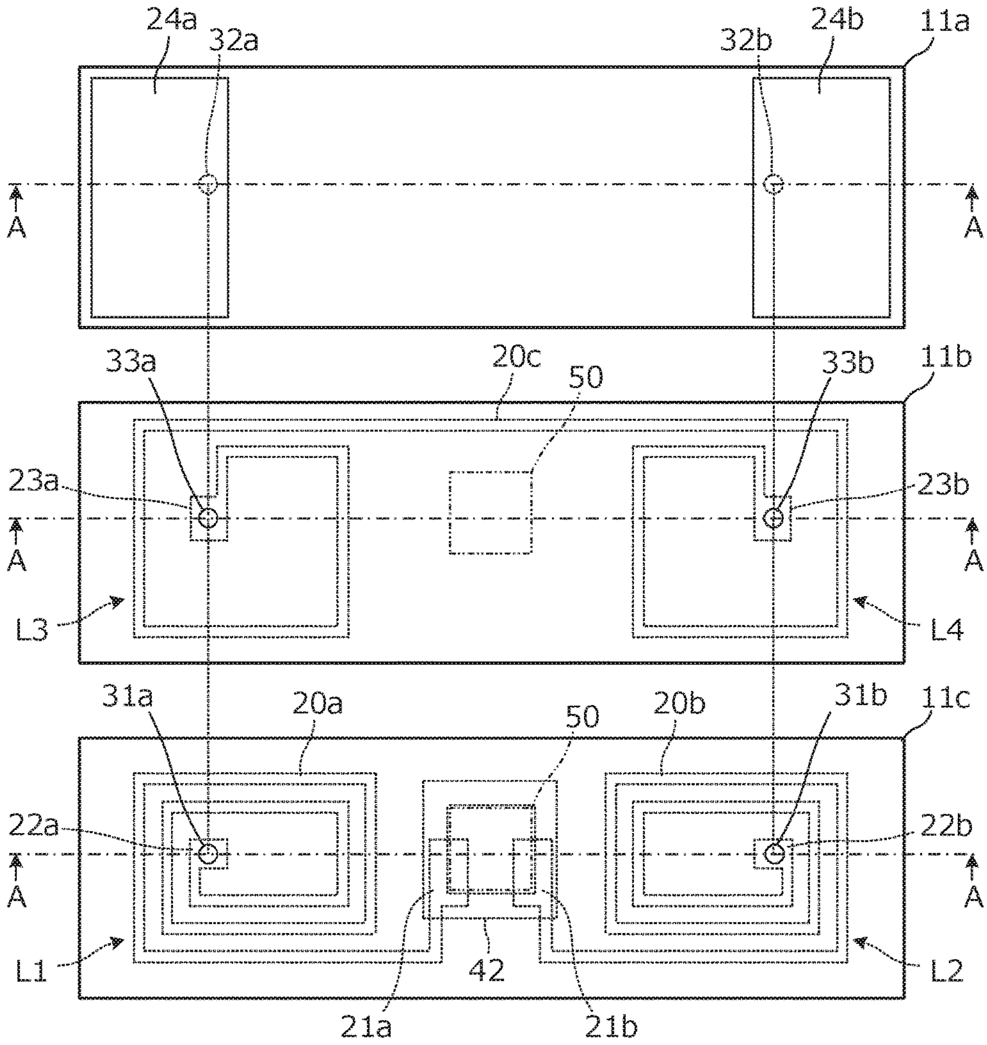
FIG. 8 is a plan view illustrating an example of thermoplastic resin sheets and various conductor patterns provided on the thermoplastic resin sheets defining an RFID module according to a third preferred embodiment of the present invention.

FIG. 8 is a plan view illustrating an example of thermoplastic resin sheets and various conductor patterns provided on the thermoplastic resin sheets defining an RFID module of the third preferred embodiment.

Spiral conductive patterns 20*a*, 20*b* having a rectangular or substantially rectangular shape are provided on a lower surface of a resin sheet 11*c*. A pad electrode 21*a* is provided at a first end of a conductor pattern 20*a*, and an end electrode 22*a* is provided at a second end of a conductor pattern 20*a*. Similarly, a pad electrode 21*b* is provided at a first end of a conductor pattern 20*b*, and an end electrode 22*b* is provided at a second end of a conductor pattern 20*b*. A conductor pattern 20*c* including two rectangular or substantially rectangular spiral portions is provided on a lower surface of a resin sheet 11*b*. End electrodes 23*a*, 23*b* are provided at both ends of the conductor pattern 20*c*. External terminals 24*a*, 24*b* are provided on an upper surface of a substrate 11*a*.

The end electrode 22*a* of the conductor pattern 20*a* and the end electrode 23*a* of the conductor pattern 20*c* are connected to each other through a via conductor 31*a*. The end electrode 22*b* of the conductor pattern 20*b* and the end electrode 23*b* of the conductor pattern 20*c* are connected to each other through a via conductor 31*b*. The end electrodes 23*a*, 23*b* of the conductor pattern 20*c* and the external terminals 24*a*, 24*b* are connected through via conductors 32*a*, 33*a*, 32*b*, 33*b*.

Figure 9:
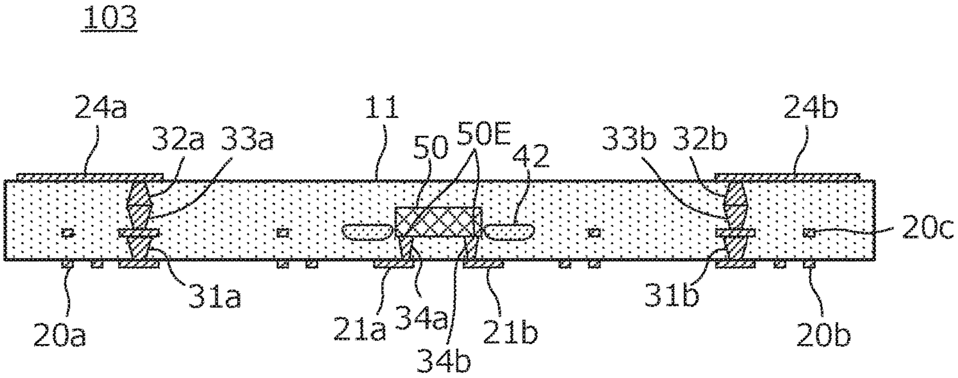
FIG. 9 is a cross-sectional view illustrating the RFID module 103 taken along a line A-A in FIG. 8.

FIG. 9 is a cross-sectional view illustrating the RFID module 103 taken along a line A-A in FIG. 8. An input and output terminal 50E of an RFID IC chip 50 is connected to the pad electrodes 21*a*, 21*b* through via conductors 34*a*, 34*b*. In planar view from the laminating direction of the resin sheet, an annular insulator pattern 42 having a rectangular or substantially rectangular shape is provided at a position overlapping the pad electrodes 21*a*, 21*b* around the RFID IC chip 50 in a laminated body 11.

The conductor patterns 20*a*, 20*b* may be covered with a resin layer by laminating the resin sheet on which the conductor pattern is not provided on a bottom of the resin sheet 11*c*.

Even in the structure in which the input and output terminal 50E of the RFID IC chip 50 is indirectly connected to the pad electrodes 21*a*, 21*b* through the via conductors 34*a*, 34*b* as in the third preferred embodiment, the insulator pattern 42 around the RFID IC chip 50 defines and functions as a reinforcing material, the deformation of the conductor patterns around the RFID IC chip 50, particularly the pad electrodes 21*a*, 21*b* is reduced or prevented, and contact between the pad electrodes 21*a*, 21*b* and the RFID IC chip 50 due to the deformation of the pad electrodes 21*a*, 21*b* is avoided.

Even in the third preferred embodiment, the insulator pattern 42 and the pad electrodes 21*a*, 21*b* are able to have various shapes as in the second preferred embodiment.

Fourth Preferred Embodiment

Some examples in which insulator patterns are provided in a plurality of layers are illustrated in a fourth preferred embodiment of the present invention.

Figure 10:
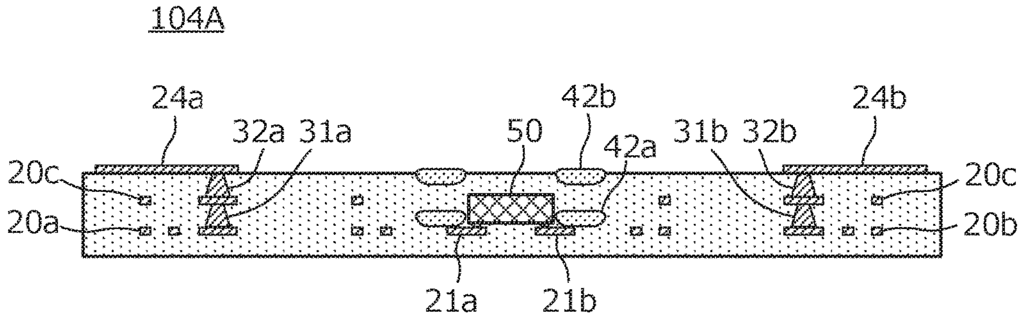
FIG. 10 is a cross-sectional view illustrating an RFID module 104A according to a fourth preferred embodiment of the present invention.

FIG. 10 is a cross-sectional view illustrating an RFID module 104A according to the fourth preferred embodiment. In this example, an annular insulator pattern 42*a* having a rectangular or substantially rectangular shape is provided at a position directly overlapping pad electrodes 21*a*, 21*b*. An annular insulator pattern 42*b* having a rectangular or substantially rectangular shape, which overlaps the pad electrodes 21*a*, 21*b* in planar view, is provided. Other configurations are the same or substantially the same as those of the RFID module 101 of the first preferred embodiment.

Figure 11:
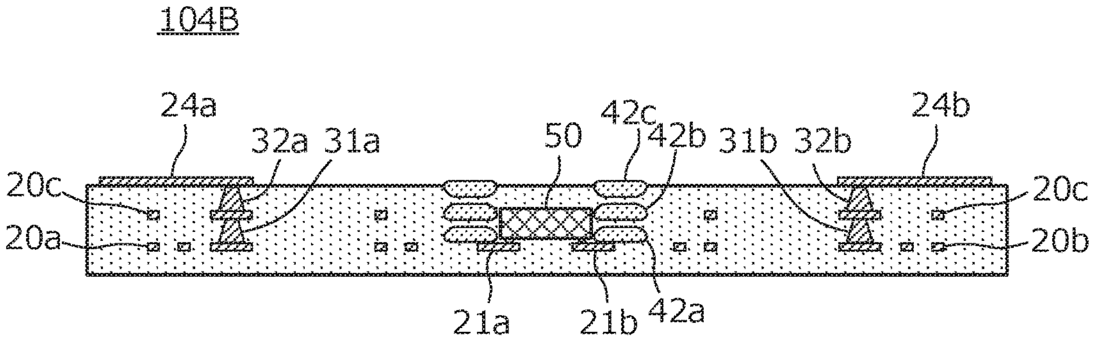
FIG. 11 is a cross-sectional view illustrating an RFID module 104B according to the fourth preferred embodiment of the present invention.

FIG. 11 is a cross-sectional view illustrating an RFID module 104B of the fourth preferred embodiment. In this example, three annular insulator patterns 42*a*, 42*b*, 42*c* having rectangular or substantially rectangular shapes are provided.

Figure 12:
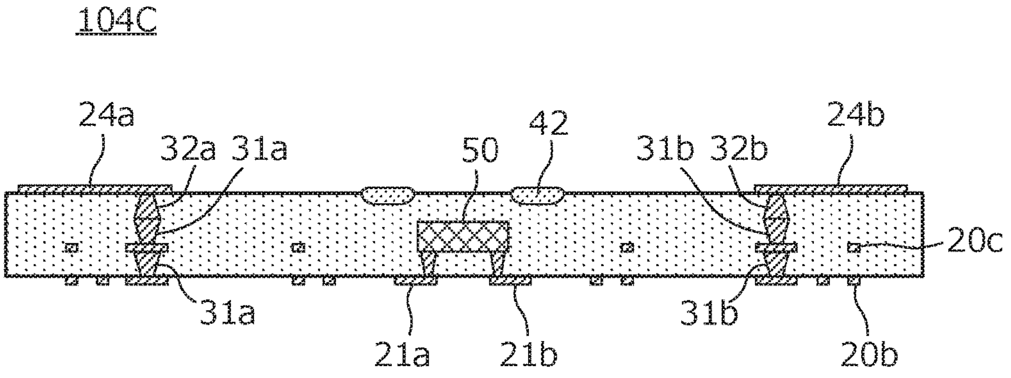
FIG. 12 is a cross-sectional view illustrating an RFID module 104C according to the fourth preferred embodiment of the present invention.

FIG. 12 is a cross-sectional view illustrating an RFID module 104C of the fourth preferred embodiment. In this example, an insulator pattern 42 is provided only in a layer different from the layer in which an RFID IC chip 50 is embedded.

Figure 13:
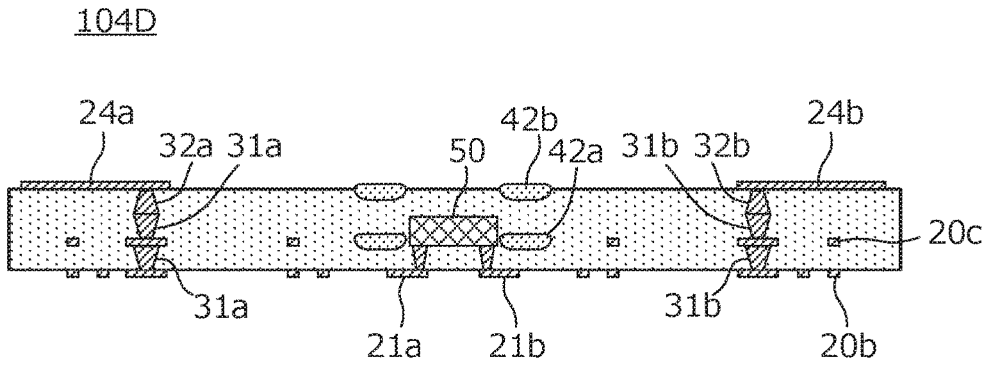
FIG. 13 is a cross-sectional view illustrating an RFID module 104D according to the fourth preferred embodiment of the present invention.

FIG. 13 is a cross-sectional view illustrating an RFID module 104D of the fourth preferred embodiment. In the structure of this example, input and output terminals of the RFID IC chip 50 are indirectly connected to the pad electrodes, and the insulator patterns 42*a*, 42*b* are provided in a plurality of layers.

As illustrated in the fourth preferred embodiment, the insulator pattern may be provided in the plurality of layers. The insulator pattern may be provided in a layer different from the embedded layer of the RFID IC chip.

Fifth Preferred Embodiment

An example of an RFID tag is illustrated in a fifth preferred embodiment of the present invention. For example, the RFID tag according to the fifth preferred embodiment is preferably applied to a linen management tag, a clothes label tag used for uniform management, and various name tags.

Figure 14:
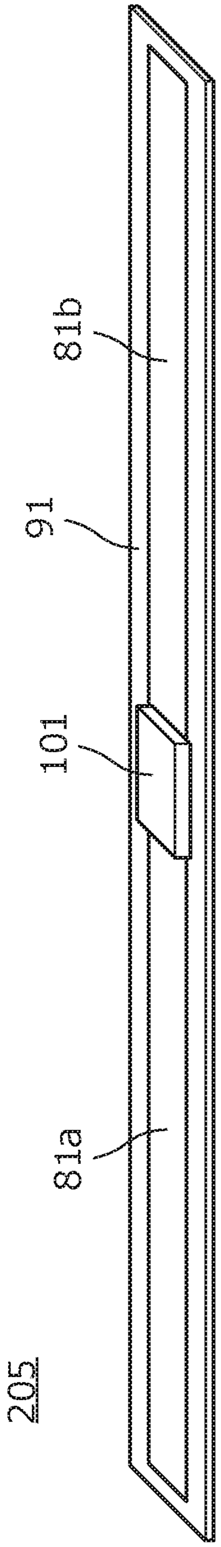
FIG. 14 is a perspective view illustrating an RFID tag 205 according to a fifth preferred embodiment of the present invention.

FIG. 14 is a perspective view illustrating an RFID tag 205 according to the fifth preferred embodiment. The RFID tag 205 includes an antenna base material 91 on which radiating elements 81*a*, 81*b* defined by conductor patterns are provided and an RFID module 101. The configuration of the RFID module 101 is preferably the same or substantially the same as that of the first preferred embodiment.

The radiating elements 81*a*, 81*b* define a dipole antenna. The antenna base 91 is a resin sheet, such as PET, for example, which has flexibility. The radiating elements 81*a*, 81*b* are flexible conductors, such as aluminum foil and copper foil, for example.

Figure 15:
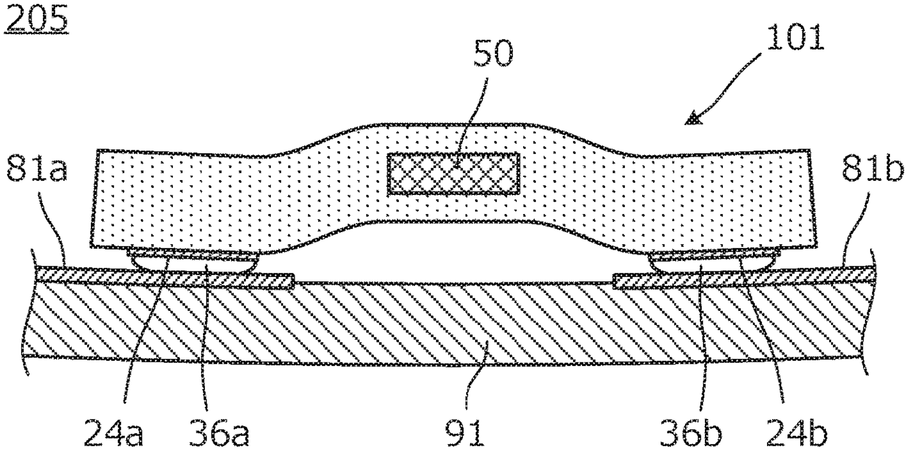
FIG. 15 is a cross-sectional view illustrating a structure of a connection portion of the RFID module 101 and an antenna base 91.

FIG. 15 is a cross-sectional view illustrating a structure of a connection portion of the RFID module 101 and the antenna base 91. External terminals 24*a*, 24*b* of the RFID module 101 are connected to the radiating elements 81*a*, 81*b* through solder 36*a*, 36*b*. In the RFID module 101, a region in which the external terminals 24*a*, 24*b* are provided and a region in which an RFID IC chip 50 is embedded are rigid regions, and other regions are flexible regions. Consequently, even when the RFID tag 205 is curved, the antenna base 91 and the RFID module 101 are flexible as illustrated in FIG. 15, and large bending stress is not applied to the RFID IC chip 50.

Figure 16:
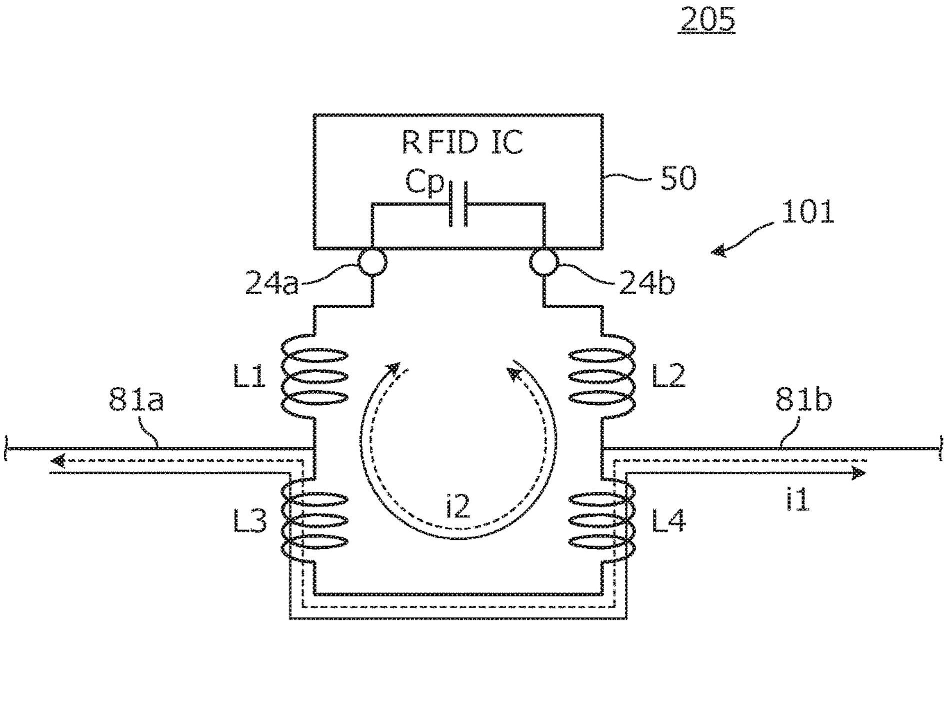
FIG. 16 is a circuit diagram illustrating operation of the RFID module 101 in an RFID tag 205.

FIG. 16 is a circuit diagram illustrating operation of the RFID module 101 in the RFID tag 205. Capacitance Cp of the RFID IC chip 50 exists between the external terminals 24*a*, 24*b*, and two resonances are generated in the RFID tag 205. A first resonance is generated in a current path, which is indicated by current i1 and defined by the radiating elements 81*a*, 81*b* and inductors L3 and L4, and a second resonance is generated in a current path (current loop), which is indicated by current i2 and defined by inductors L1 to L4 and the capacitance Cp. The two resonances are coupled by the inductors L3, L4 shared by the current paths.

Both a resonance frequency due to the first resonance and a resonance frequency due to the second resonance are affected by the inductors L3, L4. A difference of several tens of megahertz (specifically, about 5 MHz to about 50 MHz, for example) is generated between the resonance frequency due to the first resonance and the resonance frequency due to the second resonance. In this manner, a broadband resonance frequency characteristic is obtained by combining the two resonances.

Sixth Preferred Embodiment

Several RFID tags in which shapes of the antenna base material and the radiating element are different from those of the fifth preferred embodiment are illustrated in a sixth preferred embodiment of the present invention.

Figure 17A:
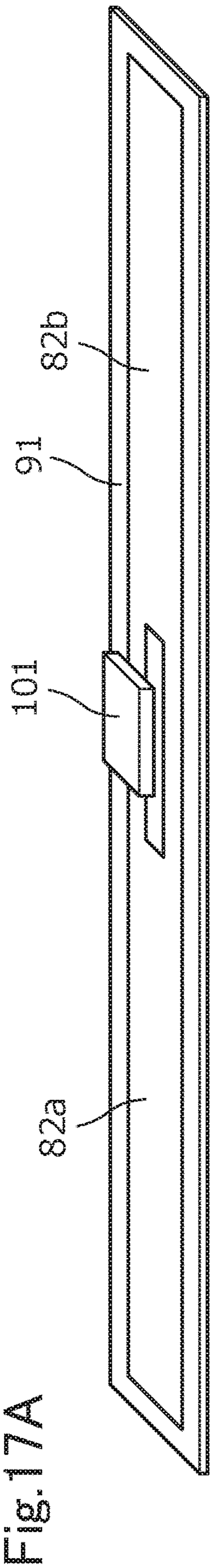
FIG. 17A is a perspective view illustrating an RFID tag 206A according to a sixth preferred embodiment of the present invention.
Figure 17B:
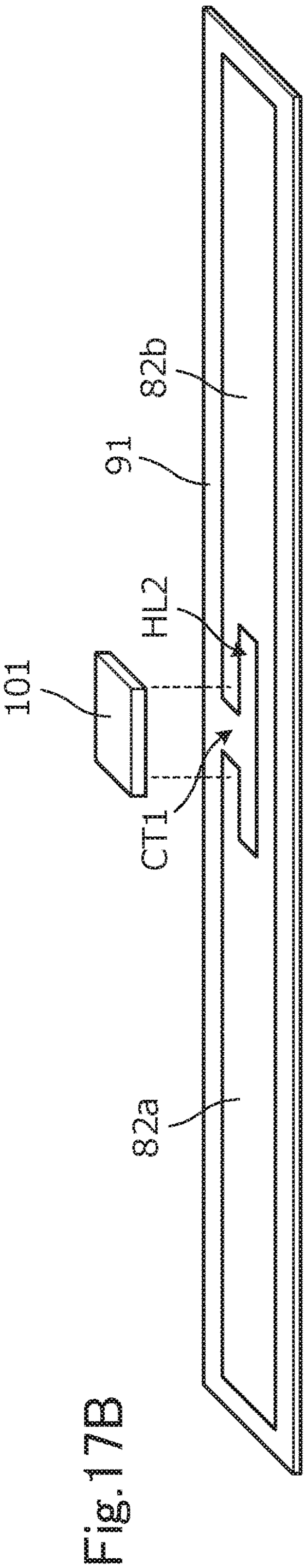
FIG. 17B is a perspective view illustrating shapes of radiating elements 81*a*, 81*b* while the RFID module 101 is separated.

FIG. 17A is a perspective view illustrating an RFID tag 206A according to the sixth preferred embodiment. FIG. 17B is a perspective view illustrating shapes of radiating elements 82*a*, 82*b* while an RFID module 101 is separated. In the center in a lengthwise direction of radiating elements 82*a*, 82*b*, a rectangular or substantially rectangular through-hole HL2 is provided, and furthermore, a notch CT1 extending from an outer edge to the through-hole HL2 is provided. In this manner, a matching conductor pattern may preferably be provided at a mounting position of the RFID module.

Figure 18:
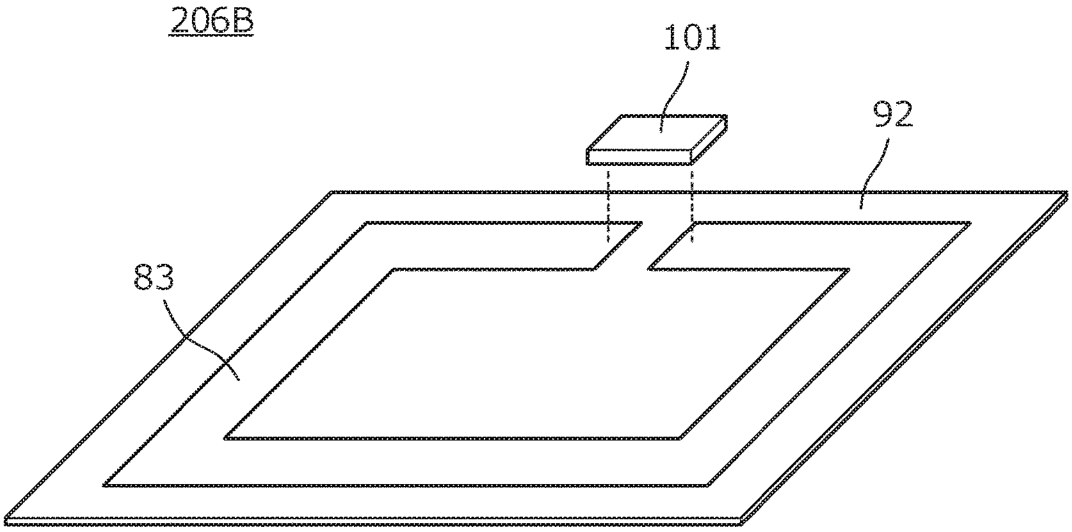
FIG. 18 is a perspective view illustrating another RFID tag 206B according to the sixth preferred embodiment of the present invention.

FIG. 18 is a perspective view illustrating another RFID tag 206B according to the sixth preferred embodiment. A rectangular or substantially rectangular loop-shaped radiating element 83 in which a portion thereof is opened is provided on the antenna base material 92, and an external terminal of the RFID module 101 is connected to the opened portion.

Figure 19:
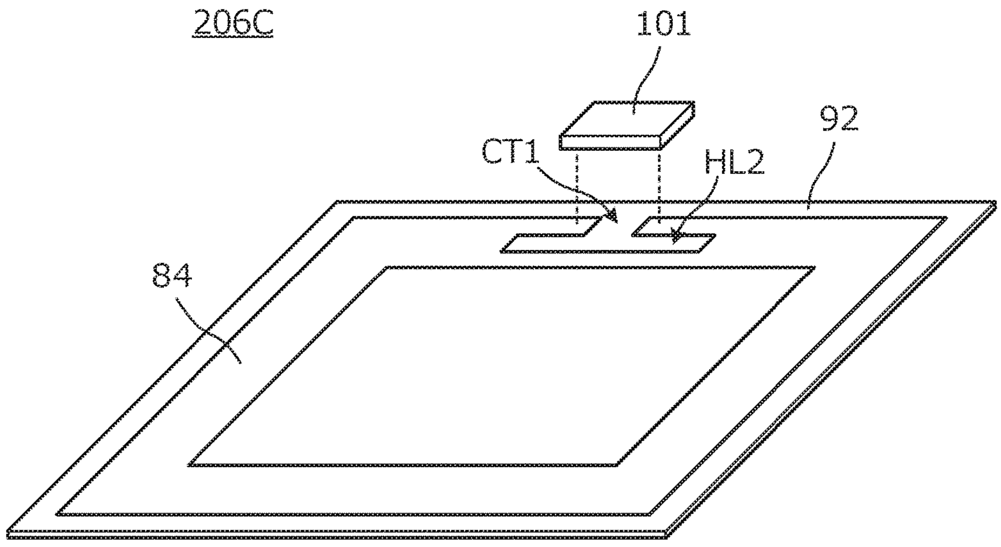
FIG. 19 is a perspective view illustrating still another RFID tag 206C according to the sixth preferred embodiment of the present invention.
Figure 20A:
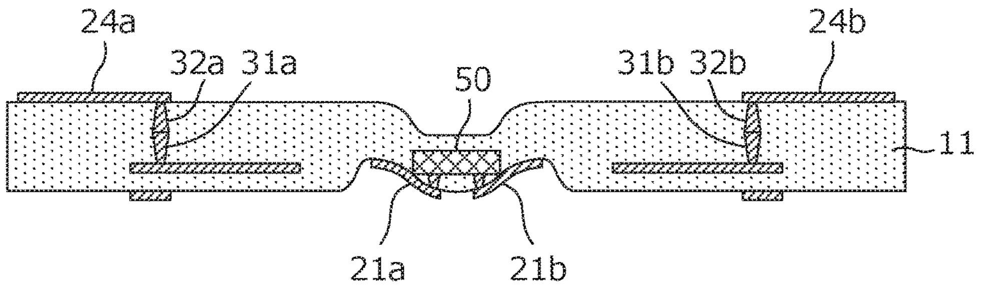
FIG. 20A is a cross-sectional view illustrating a main portion of the RFID module when an IC chip is simply embedded in a laminated body of a thermoplastic resin layer.
Figure 20B:
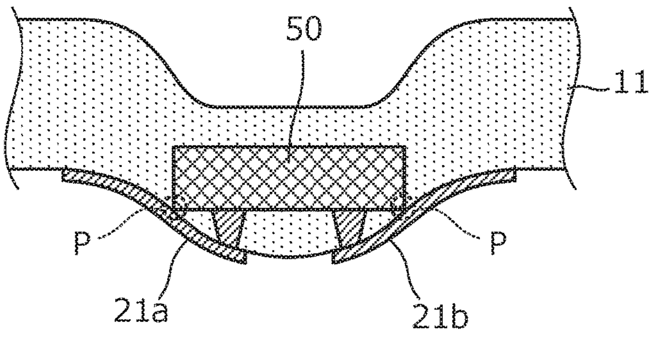
FIG. 20B is a partially enlarged view of the RFID module.
Figure 21:
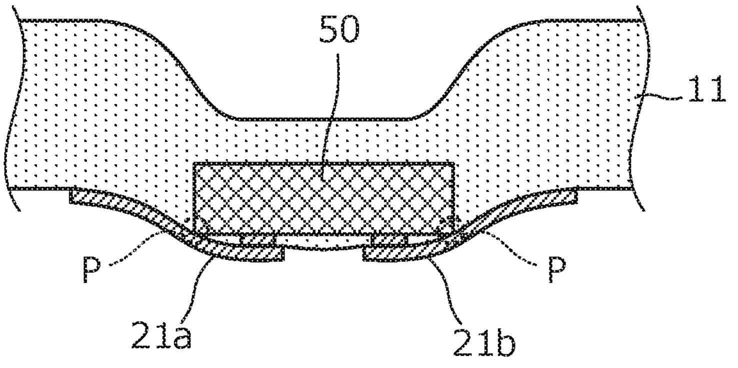
FIG. 21 is a partially enlarged cross-sectional view illustrating a main portion of another RFID module when the IC chip is embedded in the laminated body of the thermoplastic resin layer.

FIG. 19 is a perspective view illustrating still another RFID tag 206C according to the sixth preferred embodiment. A rectangular or substantially rectangular loop-shaped radiating element 84 including the through-hole HL2 and the notch CT1 similar to the radiating element in FIG. 17B is provided on the antenna base material 92, and an external terminal of the module 101 is connected to both ends of the notch CT1.

As illustrated in FIGS. 17A, 17B, and 19, a matching conductor pattern may preferably be provided in the radiating element. As illustrated in FIGS. 18 and 19, the radiating element may preferably have a loop shape, for example.

In the above examples, the via conductor is described as an example of an interlayer connection conductor connecting the conductors provided in different layers. A hole (via hole conductor hole) made in the sheet is filled with a conductive material such as conductive paste, for example, and the conductive material is metallized to define the via conductor. In addition to the via conductor, a through-hole conductor in which a metal film is provided on an inner surface of a hole by plating or other suitable method and a metal body, such as a metal pin and a stud-shaped solder are described as the interlayer connecting conductor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component built-in device comprising:

a laminated body including a plurality of thermoplastic resin layers;

a plurality of conductor patterns provided on the thermoplastic resin layers; and a chip electronic component embedded in the laminated body; wherein the chip electronic component includes an input and output terminal;

the laminated body includes a pad electrode connected to the plurality of conductor patterns;

the chip electronic component and the plurality of conductor patterns are connected to each other via a direct or indirect connection between the input and output terminal and the pad electrode;

a belt-shaped, annular-shaped, or partially annular-shaped insulator pattern overlapping the pad electrode is provided around the chip electronic component in the laminated body in a planar view from a laminating direction of the thermoplastic resin layers; and the insulator pattern does not overlap the chip electronic component in the planar view from the laminating direction.

2. The component built-in device according to claim 1, wherein the plurality of conductor patterns include a coil-shaped conductor pattern;

the coil-shaped conductor pattern is provided in a region that does not overlap the chip electronic component in the planar view from the laminating direction; and the insulator pattern is provided at a position that does not overlap the coil-shaped conductor pattern in the planar view from the laminating direction.

3. The component built-in device according to claim 1, wherein the insulator pattern overlaps an outer edge of the pad electrode in the planar view from the laminating direction.

4. The component built-in device according to claim 1, wherein the insulator pattern primarily includes a thermoplastic resin that is identical to a resin of the plurality of thermoplastic resin layers.

5. The component built-in device according to claim 1, wherein the insulator pattern is provided on at least two of the plurality of thermoplastic resin layers in the laminated body.

6. The component built-in device according to claim 1, wherein the insulator pattern surrounds an entire or substantially entire periphery of the chip electronic component in the planar view from the laminating direction.

7. The component built-in device according to claim 1, wherein the input and output terminal of the chip electronic component is in contact with the pad electrode, and at least a portion of the insulator pattern is in contact with the pad electrode.

* * * * *